(12) United States Patent
Park et al.

(10) Patent No.: US 8,680,514 B2
(45) Date of Patent: Mar. 25, 2014

(54) ELECTRIC ENERGY GENERATOR

(75) Inventors: Young-jun Park, Suwon-si (KR); Seung-nam Cha, Seoul (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 387 days.

(21) Appl. No.: 12/926,124

(22) Filed: Oct. 27, 2010

(65) Prior Publication Data

US 2011/0204317 A1 Aug. 25, 2011

(30) Foreign Application Priority Data

Feb. 19, 2010 (KR) ........................ 10-2010-0015251

(51) Int. Cl.
*H01L 21/02* (2006.01)

(52) U.S. Cl.
USPC .......... 257/40; 257/43; 257/50; 257/E27.006; 257/E27.133; 257/E33.008; 257/E51.017; 977/762; 977/837; 977/949

(58) Field of Classification Search
USPC ............... 257/13, 21, 40, 43, 50, 57, 417, 257/E21.002, 27.006, 133, 33.008, 51.001; 977/724, 730, 762, 811, 837, 948, 949
See application file for complete search history.

(56) References Cited

U.S. PATENT DOCUMENTS

| | | | | |
|---|---|---|---|---|
| 7,918,935 | B2* | 4/2011 | Park et al. ........................ | 117/68 |
| 7,936,111 | B2* | 5/2011 | Choi et al. ..................... | 310/339 |
| 7,936,112 | B2* | 5/2011 | Choi et al. ..................... | 310/339 |
| 8,039,834 | B2* | 10/2011 | Wang et al. ..................... | 257/43 |
| 2008/0067618 | A1 | 3/2008 | Wang et al. | |
| 2008/0135089 | A1 | 6/2008 | Tsakalakos et al. | |
| 2008/0156366 | A1 | 7/2008 | Kim et al. | |
| 2009/0115293 | A1* | 5/2009 | Wang et al. ..................... | 310/364 |
| 2009/0226768 | A1* | 9/2009 | Wang et al. ..................... | 429/2 |
| 2010/0013797 | A1* | 1/2010 | Kim et al. ..................... | 345/176 |
| 2010/0060109 | A1* | 3/2010 | Russell et al. ................ | 310/363 |
| 2010/0066208 | A1* | 3/2010 | Choi et al. ..................... | 310/339 |
| 2010/0136414 | A1* | 6/2010 | Choi et al. ..................... | 429/156 |
| 2010/0253184 | A1* | 10/2010 | Choi et al. ..................... | 310/339 |
| 2010/0320444 | A1* | 12/2010 | Dutta ............................. | 257/21 |
| 2011/0050042 | A1* | 3/2011 | Choi et al. ..................... | 310/339 |
| 2011/0095653 | A1* | 4/2011 | Lee ................................ | 310/339 |
| 2011/0101315 | A1* | 5/2011 | Choi et al. ..................... | 257/40 |
| 2011/0163292 | A1* | 7/2011 | Wang et al. ..................... | 257/13 |
| 2011/0163636 | A1* | 7/2011 | Sirbuly et al. ................ | 310/339 |
| 2011/0235241 | A1* | 9/2011 | Park et al. ..................... | 361/502 |

FOREIGN PATENT DOCUMENTS

KR 10-2009-0059321 6/2009

OTHER PUBLICATIONS

Wang, Z.L., "Towards Self-Powered Nanosystems: From Nanogenerators to Nanopiezotronics"; Advanced Functional Materials, (2008), Chapter 18 (pp. 1-15).

Wang et al., "Piezoelectric Nanogenerators for Self-Powered Nanodevices"; Pervasive Computing, (Jan.-Mar. 2008), vol. 7, No. 1, (pp. 49-55).

Xu, et al, "Nanowire Structured Hybrid Cell for Concurrently Scavenging Solar and Mechanical Energies"; downloaded from: http://pubs.acs.org; published Apr. 1, 2009; vol. 131, No. 16 (pp. 5866-5872).

\* cited by examiner

*Primary Examiner* — Michael Lebentritt
(74) *Attorney, Agent, or Firm* — Harness, Dickey & Pierce, P.L.C.

(57) ABSTRACT

An electric energy generator may include a semiconductor layer and a plurality of nanowires having piezoelectric characteristics. The electric energy generator may convert optical energy into electric energy if external light is applied and may generate piezoelectric energy if external pressure (e.g., sound or vibration) is applied.

24 Claims, 6 Drawing Sheets

ELECTRIC ENERGY GENERATOR

CROSS-REFERENCE TO RELATED APPLICATION

This application claims priority under 35 U.S.C. §119 to Korean Patent Application No. 10-2010-0015251, filed on Feb. 19, 2010 with the Korean Intellectual Property Office, the disclosure of which is incorporated herein in its entirety by reference.

BACKGROUND

1. Field

The present disclosure relates to electric energy generators, and more particularly, to electric energy generators using solar and piezoelectric energy.

2. Description of the Related Art

Nanowires are relatively minute wires having a diameter of several to several hundred nanometers, and are formed by using semiconductor silicon (Si), tin oxide (SnO), gallium nitride (GaN), or the like. A piezoelectric effect is a phenomenon whereby, when dynamic pressure is applied to an insulating crystal, positive charges are generated at one side of the crystal and negative charges are generated at the other side of the crystal. If pressure is applied to an electrically neutral crystal, positive and negative charges are a little polarized and, thus, charges of the same magnitude and different polarities are generated at opposite sides of the crystal. Because of this charge separation, an electric field is generated. Recent research regarding a device for generating electricity by using piezoelectric characteristics of nanowires has been conducted.

As the current energy problem worsens, solar batteries for converting solar energy into electric energy by using a photoelectric effect are attracting attention as a potential new alternative energy source. Solar batteries are divided into batteries using a Si semiconductor and batteries using a compound semiconductor. Additionally, the batteries using the Si semiconductor are divided into a crystalline Si type and an amorphous Si type. When light is incident on a solar battery, electrons and holes are generated in a semiconductor. If the electrons and holes enter an electric field formed as a result of a pn junction, the electrons will move to an n-type semiconductor and the holes will move to a p-type semiconductor, thereby generating a potential difference. In this case, if a load is connected between the p-type semiconductor and the n-type semiconductor, a current will flow through the load.

SUMMARY

An electric energy generator according to example embodiments may include a first substrate; a semiconductor layer disposed on the first substrate; a plurality of nanowires disposed on the semiconductor layer and having piezoelectric characteristics; a second substrate spaced apart from the first substrate; and an upper electrode disposed under the second substrate and forming an electrical contact with the plurality of nanowires.

An interface between the semiconductor layer and the plurality of nanowires may include a pn junction. The pn junction may be a heterojunction formed between different semiconductors. Alternatively, the pn junction may be a homojunction formed between identical semiconductors to which different dopants are doped. A bandgap of the semiconductor layer may be different from a bandgap of the plurality of nanowires.

The semiconductor layer may be separated into a plurality of semiconductor layers/patterns such that each of the plurality of nanowires is on one of the plurality of semiconductor layers/patterns. The plurality of semiconductor layers/patterns may be in a form that includes at least one of microrods, nanorods, nanowires, nanodots, and nanotubes.

The semiconductor layer may be formed by using a III-V compound semiconductor or a III-IV compound semiconductor. The upper electrode may be one of a Schottky electrode that forms a Schottky contact with the plurality of nanowires and a capacitive electrode that controls a flow of charges. The Schottky electrode may include at least one material selected from the group consisting of platinum (Pt), gold (Au), indium tin oxide (ITO), and carbon nanotubes (CNT). A work function of the upper electrode may be equal to or smaller than a work function of the plurality of nanowires.

The electric energy generator may further include a lower electrode disposed between the first substrate and the semiconductor layer. The lower electrode may be an ohmic electrode that forms an ohmic contact with the semiconductor layer. Alternatively, the electric energy generator may further include a lower electrode disposed on an edge of the semiconductor layer.

The plurality of nanowires may be formed by using a II-IV compound semiconductor. The plurality of nanowires may include at least one material selected from the group consisting of zinc oxide (ZnO), lead zirconate titanate (PZT), polyvinylidene fluoride (PVDF), and gallium nitride (GaN).

At least one of the first substrate and the second substrate may be formed by using a transparent material. The first substrate and the second substrate may be formed as flexible thin films. The first substrate and the second substrate may include at least one material selected from the group consisting of glass, silicon (Si), polymer, plastic, sapphire, GaN, and silicon carbide (SiC). The first substrate and the second substrate may be coated by using a CNT or graphene.

Another electric energy generator according to example embodiments may include a first substrate; a plurality of first electrodes disposed on the first substrate and spaced apart from each other; an insulating layer surrounding the plurality of first electrodes; a plurality of nanowires disposed on the plurality of first electrodes and having piezoelectric characteristics; a semiconductor layer covering the plurality of nanowires; a second substrate spaced apart from the first substrate; and a second electrode disposed under the second substrate and forming an electrical contact with the semiconductor layer. An interface between the semiconductor layer and the plurality of nanowires may include a pn junction.

Another electric energy generator according to example embodiments may include a substrate; a first electrode disposed on the substrate; a semiconductor layer disposed on the first electrode; a second electrode spaced apart from the first electrode on the substrate; and a plurality of nanowires having piezoelectric characteristics, each of the plurality of nanowires having a first end that contacts a surface of the semiconductor layer and a second end that forms an electrical contact with the second electrode. An interface between the semiconductor layer and the plurality of nanowires may include a pn junction.

BRIEF DESCRIPTION OF THE DRAWINGS

The above and/or other aspects of example embodiments will become more apparent and readily appreciated when the following description is taken in conjunction with the accompanying drawings of which.

DETAILED DESCRIPTION

Figure 1:
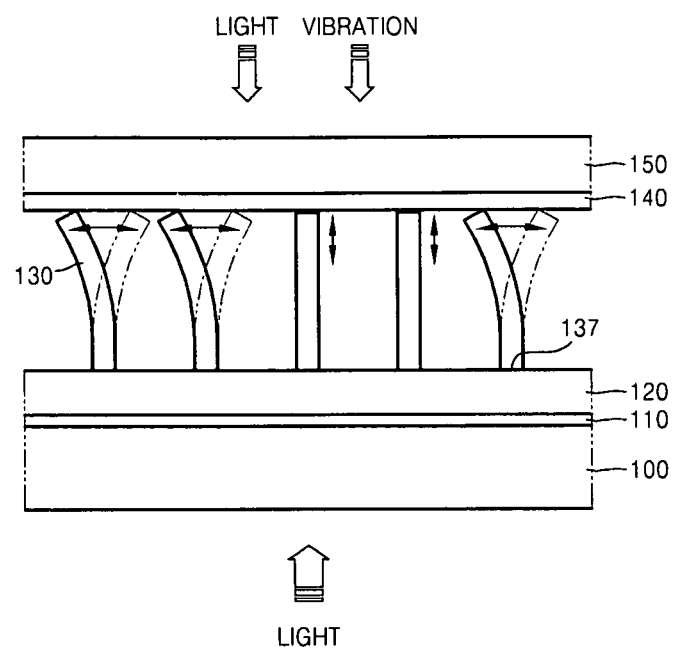
FIG. 1 is a schematic cross-sectional view of an electric energy generator according to a non-limiting embodiment of the present invention.

Various examples will now be described more fully with reference to the accompanying drawings in which some non-limiting embodiments are shown.

Detailed illustrative example embodiments are disclosed herein. However, specific structural and functional details disclosed herein are merely representative for purposes of describing example embodiments. This invention may, however, may be embodied in many alternative forms and should not be construed as limited to only the example embodiments set forth herein.

Accordingly, while example embodiments are capable of various modifications and alternative forms, the non-limiting embodiments thereof are merely shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being formed "on" another element or layer, it can be directly or indirectly formed on the other element or layer. That is, for example, intervening elements or layers may be present. In contrast, when an element or layer is referred to as being formed "directly on" another element, there are no intervening elements or layers present. Other words used to describe the relationship between elements or layers should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions may have been exaggerated for clarity. Like reference numerals in the drawings denote like elements.

FIG. 1 is a schematic cross-sectional view of an electric energy generator according to a non-limiting embodiment of the present invention.

Referring to FIG. 1, the electric energy generator according to the current non-limiting embodiment may include a first substrate 100, a first electrode 110, a semiconductor layer 120, a plurality of nanowires 130, a second electrode 140, and a second substrate 150. The first substrate 100 and the second substrate 150 may be separated from each other by a predetermined distance. The first electrode 110, the semiconductor layer 120, the nanowires 130, and the second electrode 140 may be disposed between the first substrate 100 and the second substrate 150. The first electrode 110, the semiconductor layer 120, the nanowires 130, and the second electrode 140 may form a photoelectric device, while the first electrode 110, the nanowires 130, and the second electrode 140 may form a piezoelectric device. Thus, a electric energy generator may be formed by combining a photoelectric device and a piezoelectric device.

The first substrate 100 may be formed by using at least one material selected from the group consisting of sapphire, silicon carbide (SiC), Kevlar fiber, carbon (C) fiber, cellulose fiber, polyester fiber, glass, silicon (Si), polymer, plastic, gallium nitride (GaN), carbon (C), and a carbon nanotube (CNT). The first electrode 110 may be disposed on the first substrate 100. The first electrode 110 may be formed by using at least one material selected from the group consisting of indium tin oxide (ITO), a CNT, conductive polymer, nanofiber, a nanocomposite, a gold-palladium (AuPd) alloy, gold (Au), palladium (Pd), platinum (Pt), and ruthenium (Ru), but is not limited thereto.

The semiconductor layer 120 may be disposed on the first electrode 110. The semiconductor layer 120 may be formed by using a compound semiconductor that may include a III-V compound semiconductor or a III-IV compound semiconductor. The III-V compound semiconductor may include, for example, GaN, indium gallium nitride (InGaN), aluminum gallium nitride (AlGaN), or the like, but is not limited thereto. The semiconductor layer 120 may form an ohmic contact with the first electrode 110.

The nanowires 130 may be disposed on the semiconductor layer 120. The nanowires 130 may be arranged so as to be perpendicular or slanted by a preset angle with respect to the semiconductor layer 120. The nanowires 130 may be formed of a semiconductor having piezoelectric characteristics. In more detail, the nanowires 130 may be formed by using a semiconductor that generates a piezoelectric effect when stress is applied, and the semiconductor may include a II-IV compound semiconductor. For example, the nanowires 130 may be formed by using zinc oxide (ZnO), lead zirconate titanate (PZT), polyvinylidene fluoride (PVDF), or GaN. However, the nanowires 130 are not limited to the above materials and may be formed by using other suitable materials. Alternatively, the semiconductor layer 120 itself may be used as a substrate and, in such a case, the first substrate 100 may be omitted.

If the second substrate 150 or the second electrode 140 is temporarily deformed by external pressure, the stress generated by the deformation is transferred to the nanowires 130 and, thus, the nanowires 130 may be deformed by the stress. For example, in FIG. 1, the nanowires 130 in a central portion are contracted in a direction perpendicular to the first substrate 100, while the nanowires 130 in left and right portions are bent.

The second substrate 150 that is separated from the first substrate 100 may be formed by using at least one material selected from the group consisting of glass, Si, polymer, plastic, sapphire, GaN, and SiC. The first substrate 100 and the second substrate 150 may be coated by a carbon-structured material (e.g., CNT or graphene). The second electrode 140 may be disposed under the second substrate 150. The second electrode 140 may form a Schottky contact with the nanowires 130. Stated more clearly, the second electrode 140 may be a Schottky electrode. Accordingly, the second electrode 140 may have a work function equal to or greater than that of the nanowires 130. For example, the second electrode 140 may be formed by using a material having a work function equal to or greater than 4.5. The second electrode 140 may be formed by using at least one material selected from the group consisting of, for example, ITO, a CNT, an AuPd alloy, Pd, and Ru, but is not limited thereto. Alternatively, the second electrode 140 may be a capacitive electrode that forms a capacitive contact with the nanowires 130. As such, the second electrode 140 may control the flow of charges between the second electrode 140 and the nanowires 130. Stated more clearly, the second electrode 140 may restrict the flow of charges through the second electrode 140 and the nanowires 130.

Although not shown in FIG. 1, a plurality of nanostructures may be disposed under the second substrate 150, and the second substrate 150 may be deposited by using a metal for forming the second electrode 140. As such, the contact area between the nanowires 130 and the second electrode 140 may be increased. The nanostructures may include, for example, nanoparticles, nanorods, or nanowires, and the second electrode 140 may have a rough surface because of the nanostructures. Additionally, an antireflection coating for preventing reflection of incident light may be further disposed on the first substrate 100 or the second substrate 150.

An energy conversion principal of the electric energy generator will now be described. First, a principal of converting solar energy into electric energy will be discussed. At least one of the first substrate 100 and the second substrate 150 may be transparent so as to transmit light. Additionally, at least one of the first electrode 110 and the second electrode 140 may also be transparent so as to transmit light.

An interface 137 between the semiconductor layer 120 and the nanowires 130 may include a pn junction. For example, a p-type dopant may be added to the semiconductor layer 120, and an n-type dopant may be added to the nanowires 130. Accordingly, a bandgap exists between the semiconductor layer 120 and the nanowires 130, and band bending may occur because of the bandgap. Accordingly, if light is applied to the semiconductor layer 120 and the nanowires 130, a potential difference may be generated. The semiconductor layer 120 and the nanowires 130 may form a heterojunction formed between different semiconductors or may form a homojunction formed between identical semiconductors having a bandgap from doping.

Wavelengths of light to be absorbed by the semiconductor layer 120 and the nanowires 130 may be controlled by using different types of dopant, by varying the concentration of the dopant, or by using another bandgap control method. Accordingly, light of a desired wavelength may be absorbed by the semiconductor layer 120 and the nanowires 130.

If the light transmitted through at least one of the first substrate 100 and the second substrate 150 is incident on the semiconductor layer 120 and the nanowires 130, electrons and holes may be generated. With reference to the interface 137 between the semiconductor layer 120 and the nanowires 130, the electrons may move to the second electrode 140 through the nanowires 130, while the holes may move to the first electrode 110 through the semiconductor layer 120. As a result, a current may be generated. In this case, the generated current may be a direct current (DC) of which a direction is not switched.

Next, a principal of generating piezoelectric energy will be described. If the second substrate 150 or the second electrode 140 is deformed by external sound, vibration, friction, pressure, or the like, stress generated by the deformation is transferred to the nanowires 130. If an external force is applied to the nanowires 130 as described above, a potential difference is generated between the nanowires 130 and the second electrode 140 by the piezoelectric characteristics of the nanowires 130, and electrons flow from the nanowires 130 to the second electrode 140. The electrons that move to the second electrode 140 because of the potential difference are accumulated as a result of a Schottky barrier or a higher resistance formed in the second electrode 140. Accordingly, the potential difference is gradually reduced and then ultimately disappears, resulting in an equilibrium state. Here, a Schottky barrier refers to a barrier of a potential generated when a metal and a semiconductor contact each other, and electrons do not flow in an equilibrium state when a potential difference does not exist.

If the pressure applied to the nanowires 130 is released, the nanowires 130 return from a bent or vertically contracted state to an original state. In this case, a piezoelectric potential generated in the nanowires 130 disappears, and a potential difference is generated by the disappeared piezoelectric potential, thereby causing the electrons to flow. In this case, the electrons will flow in a direction opposite to the direction in which the electrons flow when pressure is applied to the nanowires 130. Stated more clearly, the electrons flow from the second electrode 140 to the nanowires 130. Because the direction in which the electrons flow is switched according to whether pressure is applied to the nanowires 130, a current generated by the piezoelectric characteristics may be an alternating current (AC).

In the electric energy generator, a device for converting solar energy into electric energy is integrated with a device for converting mechanical energy into electric energy. Accordingly, an operation of converting solar energy into electric energy is independent from an operation of generating piezoelectric energy. Thus, the electric energy generator may generate electric energy by using solar energy if solar light is applied from outside the electric energy generator. Additionally, the electric energy generator may also generate piezoelectric energy if sound, vibration, friction, pressure, or the like is applied from outside the electric energy generator. Accordingly, the electric energy generator may generate electric energy according to an external environment and may be used as a power supply device of an optical sensor, a display apparatus, a mobile apparatus, or the like.

Figure 2:
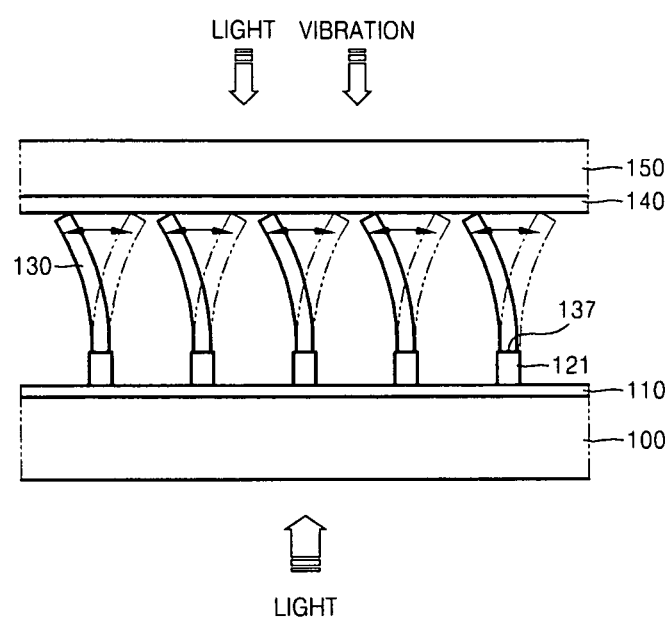
FIG. 2 is a schematic cross-sectional view of an electric energy generator according to another non-limiting embodiment of the present invention.

FIG. 2 is a schematic cross-sectional view of an electric energy generator according to another non-limiting embodiment of the present invention. FIG. 2 will be described by mainly focusing on the differences between it and FIG. 1.

Referring to FIG. 2, in the electric energy generator according to the current non-limiting embodiment, a plurality of semiconductor layers/patterns 121 are disposed only under the nanowires 130. In more detail, the semiconductor layers 121 are disposed as a plurality of separate layers instead of one continuous layer. In this case, the surface area of the first electrode 110 is greater than that of the semiconductor layers 121. Thus, the movement of charges may be improved. Also, as the interface 137 that is formed between the semiconductor layers 121 and the nanowires 130 forms a local contact and a specific surface area is improved, light absorption characteristics of the semiconductor layers 121 and the nanowires 130 may be improved. The semiconductor layers 121 may be disposed in a form that includes microrods, nanorods, nanowires, nanodots, nanotubes, or the like.

If the second substrate 150 or the second electrode 140 is deformed by external pressure, the stress generated by the deformation is transferred to the nanowires 130. Thus, the nanowires 130 may be deformed by the stress. For example, the nanowires 130 may be bent as shown in FIG. 2. Alternatively, although not shown in FIG. 2, the nanowires 130 may be contracted in a direction perpendicular to the first substrate 100.

Figure 3:
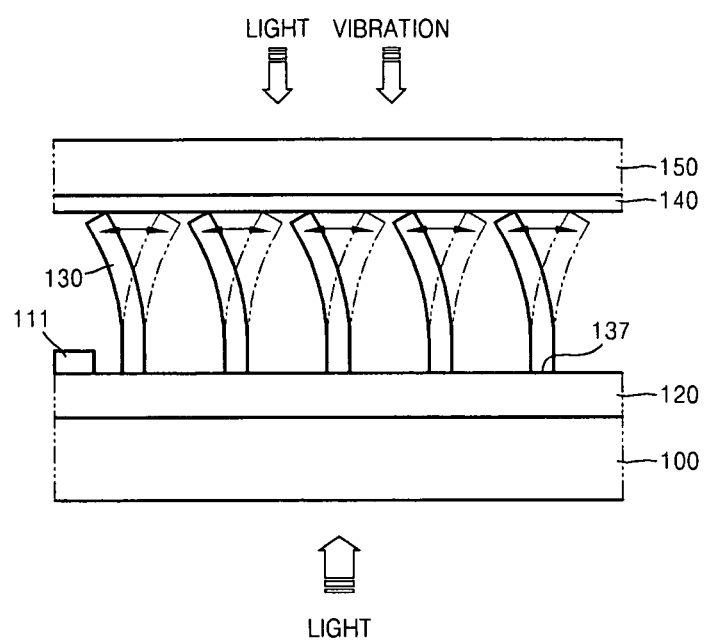
FIG. 3 is a schematic cross-sectional view of an electric energy generator according to another non-limiting embodiment of the present invention.

FIG. 3 is a schematic cross-sectional view of an electric energy generator according to another non-limiting embodiment of the present invention. FIG. 3 will be described by mainly focusing on the differences between it and FIGS. 1 and 2.

Referring to FIG. 3, a first electrode 111 that forms an electrical contact with the semiconductor layer 120 is disposed on an edge of the semiconductor layer 120. The electrical contact may be an ohmic contact. Because the first electrode 111 is disposed on an edge of the semiconductor layer 120, the reflection of light on the first electrode 111 may be minimized and, thus, the amount of light that reaches the semiconductor layer 120 may be increased. When light reaches the semiconductor layer 120 and the nanowires 130, electrons may move to the second electrode 140 through the nanowires 130, and holes may move to the first electrode 111 through the semiconductor layer 120. It should be understood that the shape and position of the first electrode 111 may be varied from that shown in FIG. 3.

If the second substrate 150 or the second electrode 140 is deformed by external pressure, the stress generated by the deformation is transferred to the nanowires 130 and, thus, the nanowires 130 may be deformed by the stress. For example, the nanowires 130 may be bent as shown in FIG. 3. Alternatively, although not shown, the nanowires 130 may be contracted in a direction perpendicular to the first substrate 100.

Figure 4:
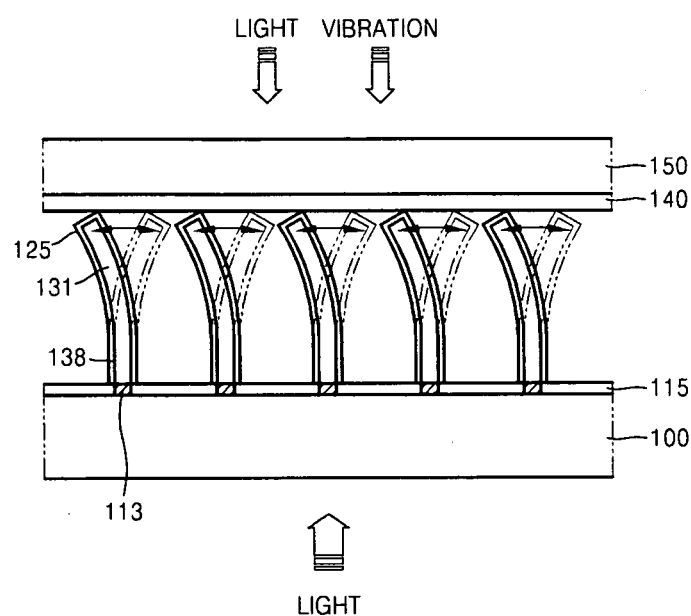
FIG. 4 is a schematic cross-sectional view of an electric energy generator according to another non-limiting embodiment of the present invention.

FIG. 4 is a schematic cross-sectional view of an electric energy generator according to another non-limiting embodiment of the present invention. FIG. 4 will be described by mainly focusing on the differences between it and FIGS. 1 through 3.

Referring to FIG. 4, a plurality of first electrodes 113 are separately disposed on the first substrate 100, and an insulating layer 115 surrounds the first electrodes 113. Although not shown in FIG. 4, the first electrodes 113 may be electrically connected to each other. A plurality of nanowires 131 are separately formed on the first electrodes 113 and are covered by a semiconductor layer 125. Stated more clearly, bottom surfaces of the nanowires 131 contact the first electrodes 113, and the side and top surfaces of the nanowires 131 are covered by the semiconductor layer 125. Accordingly, the surface area of an interface 138 between the nanowires 131 and the semiconductor layer 125 may be increased. Also, because the amount of solar light to be absorbed is increased as the surface area of the interface 138 is increased, the numbers of electrons and holes to be generated may be increased, and an efficiency of converting solar energy into electric energy may be improved.

The interface 138 between the semiconductor layer 125 and the nanowires 131 may include a pn junction. Stated more clearly, the nanowires 131 may be formed by using a semiconductor doped with an n-type dopant, while the semiconductor layer 125 may be formed by using a semiconductor doped with a p-type dopant. For example, the nanowires 131 may be formed by using ZnO, and the semiconductor layer 125 may be formed by using an organic semiconductor or an inorganic semiconductor. In this case, the nanowires 131 may form a Schottky contact with the first electrodes 113, and the semiconductor layer 125 may form an ohmic contact with the second electrode 140.

Alternatively, the nanowires 131 may be formed by using a semiconductor doped with a p-type dopant, and the semiconductor layer 125 may be formed by using a semiconductor doped with an n-type dopant. For example, the nanowires 131 may be formed by using a III-V semiconductor, and the semiconductor layer 125 may be formed by using ZnO. In this case, the nanowires 131 may form an ohmic contact with the first electrodes 113, and the semiconductor layer 125 may form a Schottky contact with the second electrode 140.

If the second substrate 150 or the second electrode 140 is deformed by external pressure, the stress generated by the deformation is transferred to the nanowires 131 and, thus, the nanowires 131 may be deformed by the stress. For example, the nanowires 131 may be bent as shown in FIG. 4. Alternatively, although not shown, the nanowires 131 may be contracted in a direction perpendicular to the first substrate 100.

Figure 5:
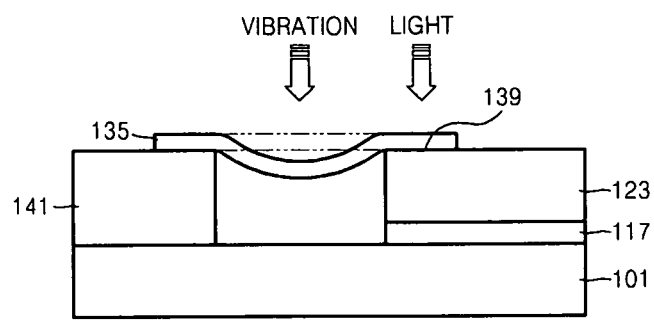
FIG. 5 is a schematic cross-sectional view of an electric energy generator according to another non-limiting embodiment of the present invention.

FIG. 5 is a schematic cross-sectional view of an electric energy generator according to another non-limiting embodiment of the present invention. FIG. 5 will be described by mainly focusing on the differences between it and FIGS. 1 through 4.

Referring to FIG. 5, a first electrode 117 is disposed on one edge portion of a substrate 101, and a semiconductor layer 123 is disposed on the first electrode 117. A second electrode 141 is formed on another edge portion of the substrate 101. Nanowires 135 are disposed on the semiconductor layer 123 in a horizontal direction. The nanowires 135 may be formed by using a lateral growth or transfer process. In FIG. 5, the nanowires 135 are grown on a top surface of the semiconductor layer 123 in a horizontal direction, and one side of the nanowires 135 forms an interface 139 with the top surface of the semiconductor layer 123.

Alternatively, although not shown in FIG. 5, the nanowires 135 may be grown on a side surface of the semiconductor layer 123. In such a case, one side of the nanowires 135 may form an interface with the side surface of the semiconductor layer 123. The other end of the nanowires 135 may form an electrical contact with the second electrode 141, wherein the electrical contact may be a Schottky contact. Unlike the electric energy generators illustrated in FIGS. 1 through 4, in which tips of the nanowires 130 or 131 that form an electrical contact with the second electrode 140 are deformed by external pressure or the like, in the electric energy generator illustrated in FIG. 5, a central portion of the nanowires 135 may be deformed by external pressure. Also, the substrate 101 may be formed by using a flexible material so as to permit deformation with relative ease by the external pressure. Although a photoelectric device and a piezoelectric device are disposed on one substrate in FIG. 5, it should be understood that the photoelectric and piezoelectric devices may be disposed on separate substrates.

Figure 6:
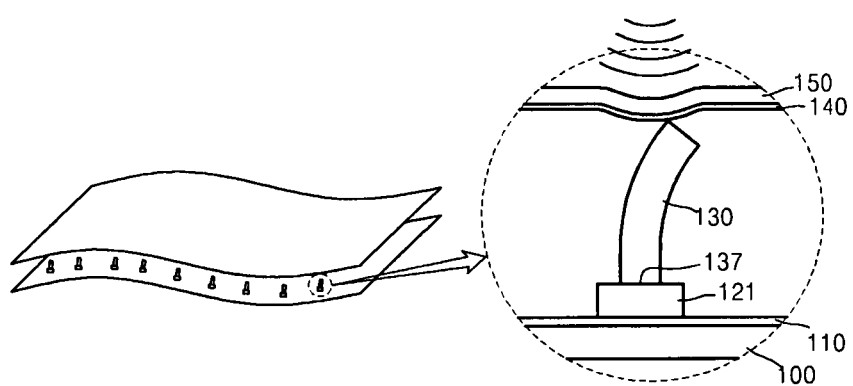
FIG. 6 is an enlarged schematic cross-sectional view of an electric energy generator according to another non-limiting embodiment of the present invention.

FIG. 6 is a schematic cross-sectional view of an electric energy generator according to another non-limiting embodiment of the present invention. FIG. 6 will be described by mainly focusing on the differences between it and FIGS. 1 through 5.

Referring to FIG. 6, the first substrate 100 and the second substrate 150 are formed as thin films. The first electrode 110, the semiconductor layers 121, the nanowires 130, and the second electrode 140 may be as described in connection with FIG. 2 and are formed between the first substrate 100 and the second substrate 150. In FIG. 6, the semiconductor layers 121 are disposed as a plurality of separate layers. Alternatively, the semiconductor layers 121 may be formed as one layer like the semiconductor layer 120 illustrated in FIG. 1. The first substrate 100 and the second substrate 150 are in the form of thin films (that permit deformation with relative ease when subjected to external vibration or pressure), are flexible, and allow the electric energy generator to have a relatively large area and a curve. It should be understood that the thin films discussed in connection with FIG. 6 may also be applied to the first substrate 100, second substrate 150, and/or substrate 101 of FIGS. 1-5. Accordingly, the electric energy generator may be manufactured in the form of a soundproof wall or a billboard.

Figure 7A:
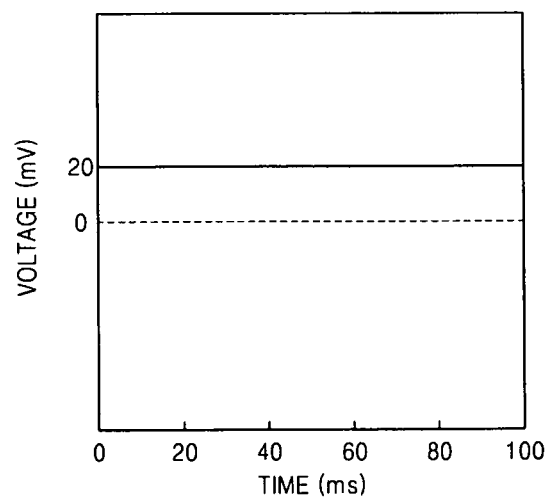
FIGS. 7A through 7C are graphs showing voltages generated by the electric energy generator illustrated in FIG. 1.
Figure 7B:
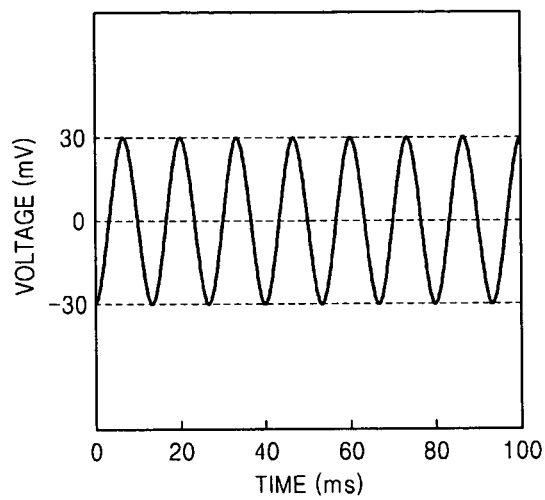
Figure 7C:
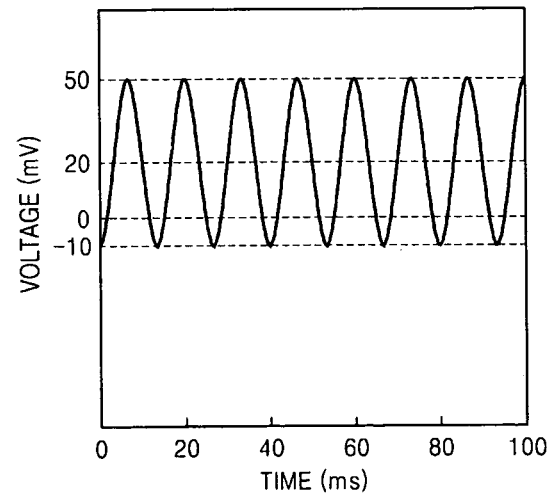

FIGS. 7A through 7C are graphs showing voltages generated by the electric energy generator illustrated in FIG. 1. In this non-limiting example, a first substrate, a first electrode, a semiconductor layer, and nanowires are respectively formed by using sapphire, silver (Ag), GaN, and ZnO, while a second electrode and a second substrate are respectively formed by using PdAu and polyethersulfone (PES).

FIG. 7A is a graph showing a voltage generated by the electric energy generator when the light of three 32 W fluorescent lamps is applied without applying vibration (e.g., sound) from outside the electric energy generator. Referring to FIG. 7A, the voltage generated by the electric energy generator is about 20 mV. If only light is applied without applying vibration (e.g., sound) from outside the electric energy generator, only solar energy is converted into electric energy without generating piezoelectric energy. Thus, a direct voltage is generated.

FIG. 7B is a graph showing a voltage generated by the electric energy generator when a sound of 80 Hz is applied without applying light from outside the electric energy generator. Referring to FIG. 7B, the voltage generated by the electric energy generator is about 30 mV. If only vibration (e.g., sound) is applied without applying light from outside the electric energy generator, only piezoelectric energy is generated without converting solar energy into electric energy. Thus, an alternating voltage is generated.

FIG. 7C is a graph showing a voltage generated by the electric energy generator when the light of three 32 W fluorescent lamps and a sound of 80 Hz are applied from outside the electric energy generator. Referring to FIG. 7C, the voltage generated by the electric energy generator corresponds to a sum of the voltages generated in FIGS. 7A and 7B. Stated more clearly, the voltage of FIG. 7C is obtained by summing a direct voltage generated by the conversion of solar energy into electric energy and an alternating voltage generated using piezoelectric energy.

A non-limiting representative method of manufacturing the electric energy generator illustrated in FIG. 1 will now be described. Initially, the first substrate 100 is prepared and the first electrode 110 is formed on the first substrate 100. The first electrode 110 may be formed by using a conductive material and by performing plating, sputtering, e-beam evaporation, thermal evaporation, or the like. The semiconductor layer 120 is formed on the first electrode 110. A buffer layer may be formed on the semiconductor layer 120 and may contain aluminum nitride (AlN). The nanowires 130 may be formed on the semiconductor layer 120 after forming a catalyst layer on the semiconductor layer 120 by using gold (Au), zinc (Zn), ZnO, or the like, or without forming the catalyst layer. The nanowires 130 may be grown by performing a sol-gel process, hydrothermal synthesis, chemical vapor deposition (CVD), or the like. For example, the nanowires 130 may be grown by forming a GaN crystalline layer as a semiconductor layer on a sapphire substrate, depositing an Au catalyst layer, increasing the temperature to about 950° C., injecting powder in which Zn and C are mixed, together with an argon (Ar) gas, and performing cooling and post-processing.

Stated in further detail, if a CVD method is used, then a catalyst layer (e.g., a thin Au, Zn, or ZnO film) is formed on a substrate, and the nanowires 130 may be grown by carrying a Zn vapor generated from a Zn source in a relatively high-temperature atmosphere (e.g., 950° C.) to the catalyst layer with a carrier gas (e.g., Ar). In another non-limiting embodiment, if a hydrothermal synthesis method is used, then a catalyst layer (e.g., a thin Au, ZnO, or Zn acetate film) is formed on a substrate, and the nanowires 130 may be grown by dipping or floating the substrate in an aqueous solution of hexamethylenetetramine (HMTA) and a Zn nitrate in a relatively high-temperature atmosphere (e.g., about 70 to 100° C.).

After the nanowires 130 are grown, the second substrate 150 is prepared and the second electrode 140 is formed under the second substrate 150. The second electrode 140 may be formed by using a metal that may form a Schottky contact with the nanowires 130, and by performing plating, sputtering, e-beam evaporation, thermal evaporation, or the like. The first substrate 100 and the second substrate 150 are assembled and fixed such that the nanowires 130 and the second electrode 140 may form a Schottky contact.

Alternatively, if a semiconductor layer 125 is to be formed on the nanowires 131 (as illustrated in FIG. 4), then a CVD method may be used. For example, the semiconductor layer 125 may be formed by depositing a semiconductor material on the nanowires 131 at a temperature equal to or greater than about 500° C. Alternatively, the semiconductor layer 125 may be formed by coating an organic semiconductor material on the nanowires 131 at a relatively low temperature.

The characteristics of an electrode may be determined according to a difference between an electron affinity of nanowires and a work function of the electrode. Stated more clearly, if the electron affinity of the nanowires is equal to or greater than the work function of the electrode, then the electrode may be a Schottky electrode. Otherwise, if the electron affinity of the nanowires is less than the work function of the electrode, then the electrode may be an ohmic electrode.

It should be understood that the example embodiments described herein should be considered in a descriptive sense only and not for purposes of limitation. Descriptions of features or aspects within each embodiment should typically be considered as available for other similar features or aspects in other embodiments.

What is claimed is:
1. An electric energy generator comprising:
a first substrate;
a semiconductor layer on the first substrate;
a plurality of nanowires on the semiconductor layer and having piezoelectric characteristics;
a second substrate spaced apart from the first substrate; and an upper electrode under the second substrate and forming an electrical contact with the plurality of nanowires;
wherein the semiconductor layer includes a compound semiconductor.

2. The electric energy generator of claim 1, wherein an interface between the semiconductor layer and the plurality of nanowires includes a pn junction.

3. The electric energy generator of claim 2, wherein the pn junction is a heterojunction formed of different semiconductors.

4. The electric energy generator of claim 2, wherein the pn junction is a homojunction formed of identical semiconductors with different dopants.

5. The electric energy generator of claim 1, wherein a bandgap of the semiconductor layer is different from that of the plurality of nanowires.

6. The electric energy generator of claim 1, wherein the semiconductor layer is separated into a plurality of semiconductor patterns such that each of the plurality of nanowires is on one of the plurality of semiconductor patterns.

7. The electric energy generator of claim 6, wherein the plurality of semiconductor patterns are in a form that includes at least one of microrods, nanorods, nanowires, nanodots, and nanotubes.

8. The electric energy generator of claim 1, wherein the semiconductor layer is formed of a III-V compound semiconductor or a III-IV compound semiconductor.

9. The electric energy generator of claim 1, wherein the upper electrode is one of a Schottky electrode that forms a Schottky contact with the plurality of nanowires and a capacitive electrode that controls a flow of charges.

10. The electric energy generator of claim 9, wherein the Schottky electrode includes at least one material selected from the group consisting of platinum (Pt), gold (Au), indium tin oxide (ITO), and carbon nanotubes (CNT).

11. The electric energy generator of claim 1, wherein a work function of the upper electrode is equal to or smaller than that of the plurality of nanowires.

12. The electric energy generator of claim 1, further comprising:
a lower electrode between the first substrate and the semiconductor layer.

13. The electric energy generator of claim 12, wherein the lower electrode is an ohmic electrode that forms an ohmic contact with the semiconductor layer.

14. The electric energy generator of claim 1, further comprising:
a lower electrode on an edge of the semiconductor layer.

15. The electric energy generator of claim 1, wherein the plurality of nanowires are formed of a II-IV compound semiconductor.

16. The electric energy generator of claim 1, wherein the plurality of nanowires include at least one material selected from the group consisting of zinc oxide (ZnO), lead zirconate titanate (PZT), polyvinylidene fluoride (PVDF), and gallium nitride (GaN).

17. The electric energy generator of claim 1, wherein at least one of the first substrate and the second substrate is formed of a transparent material.

18. The electric energy generator of claim 1, wherein the first substrate and the second substrate are formed as flexible thin films.

19. The electric energy generator of claim 1, wherein the first substrate and the second substrate include at least one material selected from the group consisting of glass, silicon (Si), polymer, plastic, sapphire, GaN, and silicon carbide (SiC).

20. The electric energy generator of claim 19, wherein the first substrate and the second substrate are coated with a carbon nanotube (CNT) or graphene.

21. An electric energy generator comprising:
a first substrate;
a plurality of first electrodes on the first substrate and spaced apart from each other;
an insulating layer surrounding the plurality of first electrodes;
a plurality of nanowires on the plurality of first electrodes and having piezoelectric characteristics;
a semiconductor layer covering the plurality of nanowires;
a second substrate spaced apart from the first substrate; and
a second electrode under the second substrate and forming an electrical contact with the semiconductor layer.

22. The electric energy generator of claim 21, wherein an interface between the semiconductor layer and the plurality of nanowires includes a pn junction.

23. An electric energy generator comprising:
a first electrode on a substrate;
a semiconductor layer on the first electrode;
a second electrode spaced apart from the first electrode on the substrate; and
a plurality of nanowires having piezoelectric characteristics, each of the plurality of nanowires having a first end that contacts a surface of the semiconductor layer and a second end that forms an electrical contact with the second electrode.

24. The electric energy generator of claim 23, wherein an interface between the semiconductor layer and the plurality of nanowires includes a pn junction.

* * * * *